(12) United States Patent
Nowak et al.

(10) Patent No.: US 9,670,379 B2
(45) Date of Patent: Jun. 6, 2017

(54) COMPOSITES TRANSMISSIVE TO VISUAL AND INFRARED RADIATION AND COMPOSITIONS AND METHODS FOR MAKING THE COMPOSITES

(71) Applicant: The Boeing Company, Chicago, IL (US)

(72) Inventors: Andrew P. Nowak, Los Angeles, CA (US); April R. Rodriguez, Marina Del Ray, CA (US); Erin E. Stache, Glendale, CA (US)

(73) Assignee: THE BOEING COMPANY, Chicago, IL (US)

( * ) Notice: Subject to any disclaimer, the term of this patent is extended or adjusted under 35 U.S.C. 154(b) by 0 days.

(21) Appl. No.: 14/807,872

(22) Filed: Jul. 23, 2015

(65) Prior Publication Data

US 2017/0022389 A1     Jan. 26, 2017

(51) Int. Cl.
*C09D 181/00*     (2006.01)
*C08K 3/00*     (2006.01)
(Continued)

(52) U.S. Cl.
CPC ............. *C09D 181/00* (2013.01); *B05D 5/06* (2013.01); *B29C 39/003* (2013.01); *B29C 70/58* (2013.01);
(Continued)

(58) Field of Classification Search
CPC .............................. C07C 321/02; C08F 136/06
See application file for complete search history.

(56) References Cited

U.S. PATENT DOCUMENTS 3,030,344 A * 4/1962 Argabright .............. C08C 19/20
                                                                   522/1
3,505,166 A     4/1970 Jones et al.
(Continued)

FOREIGN PATENT DOCUMENTS

EP     0503757 A2     9/1992
EP     0665219 A1     8/1995
(Continued)

OTHER PUBLICATIONS

Encyclopedia (Encyclopedia of Polymer Science and Engineering, Wiley-Interscience, vol. 15, 1989, pp. 670-674).*
(Continued)

*Primary Examiner* — Kuo-Liang Peng
(74) *Attorney, Agent, or Firm* — MH2 Technology Law Group LLP

(57) ABSTRACT

A composition comprises a copolymer made from a thiol terminated hydrocarbon monomer and at least one additional monomer chosen from the compounds of i) a terminally unsaturated hydrocarbon monomer, ii) an isocyanate functionalized hydrocarbon monomer and iii) a silane monomer substituted with two or more $C_2$ to $C_8$ terminally unsaturated alkenyl groups or $C_2$ to $C_8$ terminally unsaturated alkynyl groups. The composition also includes a particulate filler dispersed in the copolymer and a solvent. If the terminally unsaturated hydrocarbon monomer is polybutadiene, the polybutadiene contains from about 0 mol % to about 30 mol % of polymer units in a cis-1,4-butadiene form. Composites made from the composition and methods for making composite panels are also disclosed.

32 Claims, 2 Drawing Sheets

(51) Int. Cl.

| | | |
|---|---|---|
| C08K 5/00 | (2006.01) | |
| C08G 18/22 | (2006.01) | |
| C08G 18/38 | (2006.01) | |
| C08G 75/045 | (2016.01) | |
| C08G 75/26 | (2006.01) | |
| G03F 7/004 | (2006.01) | |
| G02C 7/02 | (2006.01) | |
| B05D 5/06 | (2006.01) | |
| B29C 39/00 | (2006.01) | |
| B29C 70/58 | (2006.01) | |
| C08K 3/16 | (2006.01) | |
| G02B 1/04 | (2006.01) | |
| B29K 81/00 | (2006.01) | |
| B29K 105/00 | (2006.01) | |
| B29K 105/16 | (2006.01) | |
| B29K 509/00 | (2006.01) | |
| B29L 11/00 | (2006.01) | |

(52) U.S. Cl.
CPC ............ *C08G 18/22* (2013.01); *C08G 18/38* (2013.01); *C08G 18/3876* (2013.01); *C08G 75/045* (2013.01); *C08G 75/26* (2013.01); *C08K 3/00* (2013.01); *C08K 3/16* (2013.01); *C08K 5/00* (2013.01); *G02C 7/02* (2013.01); *G03F 7/004* (2013.01); *B29K 2081/00* (2013.01); *B29K 2105/0058* (2013.01); *B29K 2105/0085* (2013.01); *B29K 2105/16* (2013.01); *B29K 2509/00* (2013.01); *B29K 2995/0026* (2013.01); *B29K 2995/0027* (2013.01); *B29K 2995/0029* (2013.01); *B29L 2011/00* (2013.01); *C08K 2003/162* (2013.01); *G02B 1/04* (2013.01); *G02B 1/043* (2013.01)

(56) References Cited

U.S. PATENT DOCUMENTS

| | | | |
|---|---|---|---|
| 3,624,160 A | | 11/1971 | Jones et al. |
| 3,689,450 A | * | 9/1972 | Warner ............... C08C 19/20 524/113 |
| 4,390,595 A | | 6/1983 | Yamagishi |
| 6,225,021 B1 | | 5/2001 | Widawski et al. |
| 6,399,190 B1 | | 6/2002 | Myers et al. |
| 8,334,340 B2 | | 12/2012 | O'Brien et al. |
| 2010/0112259 A1 | | 5/2010 | Cruse et al. |
| 2014/0329939 A1 | * | 11/2014 | Iliopoulos ............... C08C 19/20 524/68 |

FOREIGN PATENT DOCUMENTS

| | | |
|---|---|---|
| EP | 1988110 A1 | 11/2008 |
| EP | 2725045 A1 | 4/2014 |
| JP | 2002348349 A | 12/2002 |
| JP | 2012153794 A | 8/2012 |
| KR | 100859759 B1 | 9/2008 |
| WO | 2010059363 A1 | 5/2010 |
| WO | 2010059402 A1 | 5/2010 |
| WO | 2013 092809 * | 6/2013 |

OTHER PUBLICATIONS

Charles E. Hoyle et al., "Thiol-Enes: Chemistry of the Past with Promise for the Future", Highlight, Journal of Polymer Science: Part A: Polymer Chemistry, vol. 42, 2004, pp. 5301-5338.
Sharad D. Bhagat et al., "High Refractive Index Polymers Based on Thio-Ene Cross-Linking Using Polarizable Inorganic/Organic Monomers", Macromolecules, 45, 2012, 10 pages (including 2 page supplement).
S. Krimm, "Infrared Spectra of High Polymers", Fortschr. Hochpolym.-Forsch., Bd. 2, S., 1960, pp. 51-172.
Hao-Xin Mai et al., "High-Quality Sodium Rare-Earth Fluoride Nanocrystals: Controlled Synthesis and Optical Properties", J. Am. Chem. Soc. 128, 2006, pp. 6426-6436.
Hoa-Xin Mai et al., Supporting information for ja060212h, "High-Quality Sodium Rare-Earth Fluoride Nanocrystals: Controlled Synthesis and Optical Properties", Beijing National Laboratory for Molecular Sciences, State Key Lab of Rare Earth Materials Chemistry and Applications & PKU-HKU Joint Lab in Rare Earth Materials and Bioinorganic Chemistry, Peking University, Beijing 100871, China, Electron Microscopy Laboratory, Peking University, Beijing 100871, China, (date not available) pp. S1-S13.
Partial European Search Report for European Appl. No. 16 17 9808, dated Dec. 9, 2016.

* cited by examiner

COMPOSITES TRANSMISSIVE TO VISUAL AND INFRARED RADIATION AND COMPOSITIONS AND METHODS FOR MAKING THE COMPOSITES

DETAILED DESCRIPTION

Field of the Disclosure

The present disclosure is directed to polymeric films that are transmissive to radiation in the visual and infrared wavelengths.

Background

Modern infrared cameras operate over multiple bands in both the midwave and longwave infrared spectrums. In order to function successfully, the camera's detector surface must be enclosed in an IR transmissive window or domed enclosure. When used in service on an automotive or aerospace vehicle, the enclosure must not only be IR transmissive but be able to withstand considerable environmental exposure in the form of temperature extremes along with high speed wind, rain, ice, dust and dirt erosion. Such conditions will rapidly degrade soft non-durable transmission windows through erosion and surface etching.

Beyond the direct needs of pure infrared systems, current advanced imaging systems look to combine detection capabilities in both the visible and IR wavelength ranges. This presents a requirement for moldable, durable window materials that are not only transparent in the IR, but also in the visible spectrum. There are relatively few pure materials with such broadband transmission and those that do exist are often ionic crystals or semiconductors typically resulting in brittle bulk material properties and significant aqueous solubility. These properties limit the material's potential for applications in which moldable, durable materials having the ability to withstand long term environmental exposure are desired.

For example, current state of the art IR transmissive windows such as germanium, $BaF_2$, ZnS, ZnSe, $CaF_2$, NaCl, KCl, Si, Saphire, MgO, $MgF_2$, PbF, LiF, GaAs, fused silica, CdTe, $AsS_3$, KBr, Csl, diamond, Thallium Bromoiodide (ThBrl), Thallium Bromochloride (ThBrCl), and Germanium Arsenic Selenide, suffer from one or more of the following issues: opacity in the visual wavelengths, brittle crystalline behavior, difficulty of making windows that are of suitable size and also visually transparent, and/or being composed of hygroscopic salts. These properties often preclude their use in many environmentally challenging applications where exposure to heat, impact, and moisture are expected. The use of tougher polymeric materials for visual and IR transmissive panels is limited by the tendency of the majority of polymeric materials (e.g., polycarbonate, polystyrene, Teflon, polyethylene, and polypropylene) to display one or more of the following shortcomings: broadband IR absorbance, visual opacity, and relatively low softening temperatures.

One visually and IR transparent semiconducting material is CLEARTRAN™, made by Dow Chemical. CLEARTRAN is a specially processed ZnS window. Thus, CLEARTRAN is not a composite material but rather pure ZnS specially modified to enhance visual transparency. As a result, it is susceptible to the same problems as traditional bulk ZnS suffers, including fragility and inability to be processed into conformal parts.

An IR transparent polymeric material is POLYIR® made by Fresnel Technologies. POLYIR is a collection of flexible plastic materials that display good transparency in multiple IR bands. However, POLYIR materials show significant visual haze or opacity, lower maximum service temperatures and limited tolerance to sunlight and other environmental factors.

U.S. Pat. No. 4,390,595 discloses a composite sandwich structure including an IR transparent window substrate covered by a hydrocarbon layer. The window substrate is made of a IR transparent monolithic material, such as germanium, zinc sulfide, zinc selenide or silicon. While this composite material is disclosed as being resistant to moisture and oxidation, and is said to be abrasion resistant, it is limited to many of the same fundamental shortcomings as the monolithic window substrate. These shortcomings include susceptibility to cracking of the brittle IR transparent layer, inability to be adapted for complex conformal surfaces, and damage tolerance of the thin polymer layer.

Thus, there is a need in the art for materials and processes that can provide for windows or coatings having broadband transmission in both the visible and IR spectrums, while being capable of being formed in complex curved shapes and/or displaying the mechanical durability to meet environmental challenges experienced on many vehicles, or in other applications such as helmet cams or CCTVs.

SUMMARY

The present disclosure is directed to a composition. The composition comprises: a copolymer made from a thiol terminated hydrocarbon monomer and at least one additional monomer chosen from the compounds of i) a terminally unsaturated hydrocarbon monomer, ii) an isocyanate functionalized hydrocarbon monomer and iii) a silane monomer substituted with two or more $C_2$ to $C_8$ terminally unsaturated alkenyl groups or $C_2$ to $C_8$ terminally unsaturated alkynyl groups; a particulate filler dispersed in the copolymer; and a solvent, with the proviso that if the terminally unsaturated hydrocarbon monomer is polybutadiene, the polybutadiene contains from about 0 mol % to about 30 mol % of polymer units in a cis-1,4-butadiene form.

The present disclosure is also directed to a composite. The composite comprises: a copolymer made from a thiol terminated hydrocarbon monomer and at least one additional monomer chosen from the compounds of i) a terminally unsaturated hydrocarbon monomer, ii) an isocyanate functionalized hydrocarbon monomer and iii) a silane monomer substituted with two or more $C_2$ to $C_8$ terminally unsaturated alkenyl groups or $C_2$ to $C_8$ terminally unsaturated alkynyl groups; and a particulate filler dispersed in the copolymer, wherein the composite is transmissive to radiation at one or more wavelengths in both the visible and infrared spectrums.

A method of making a composite panel. The method comprises i) depositing a layer of a composite mixture on a substrate, the composite mixture comprising: a) a copolymer made from a thiol terminated hydrocarbon monomer and at least one additional monomer chosen from the compounds of i) a terminally unsaturated hydrocarbon monomer, ii) an isocyanate functionalized hydrocarbon monomer and iii) a silane monomer substituted with two or more $C_2$ to $C_8$ terminally unsaturated alkenyl groups or $C_2$ to $C_8$ terminally unsaturated alkynyl groups, b) a particulate filler, and c) a solvent. The method further comprises ii) drying the layer; iii) repeating i) and ii) one or more times to form a thin film stack; and iv) heating the thin film stack at an annealing temperature and annealing pressure to consolidate the film stack into a single composite layer.

The composites of the present disclosure provide one or more of the following advantages: a material transmissive (e.g., transparent or translucent) in the visible and IR wavelength ranges; a material that demonstrates mechanical and/or thermal durability to environmental exposure to high speed wind, rain and UV; a material suitable for windows for combined visible and IR detection systems; windows of improved environmental durability with respect to temperature and/or abrasion for visible and IR detection systems; and moldable or shapeable windows for visible and IR detection systems.

It is to be understood that both the foregoing general description and the following detailed description are exemplary and explanatory only and are not restrictive of the present teachings, as claimed.

BRIEF DESCRIPTION OF THE DRAWINGS

The accompanying drawings, which are incorporated in and constitute a part of this specification, illustrates aspects of the present teachings and together with the description, serve to explain the principles of the present teachings.

DESCRIPTION

Figure 1A:
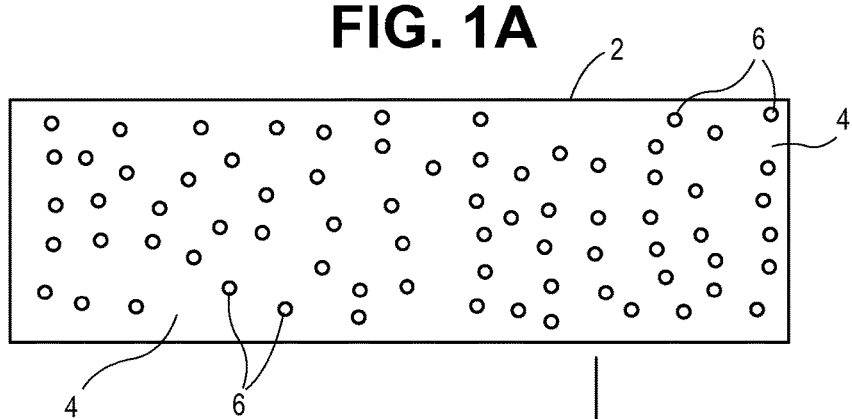
FIGS. 1A to 1D illustrate a process for making a composite window, according to an aspect of the present disclosure.
Figure 1B:
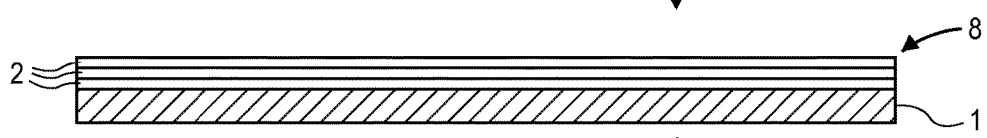

Reference will now be made in detail to the present teachings, examples of which are illustrated in the accompanying drawings. In the drawings, like reference numerals have been used throughout to designate identical elements. In the following description, reference is made to the accompanying drawings that form a part thereof, and in which is shown by way of illustration specific examples of practicing the present teachings. The following description is, therefore, merely exemplary.

The present disclosure is directed to a composition. The composition comprises a sulfur containing copolymer; a particulate filler dispersed in the copolymer and a solvent. The sulfur containing copolymer is made from a thiol terminated hydrocarbon monomer and at least one additional monomer chosen from the compounds of i) a terminally unsaturated hydrocarbon monomer, ii) an isocyanate functionalized hydrocarbon monomer and iii) a silane monomer substituted with two or more $C_2$ to $C_8$ terminally unsaturated alkenyl groups or $C_2$ to $C_8$ terminally unsaturated alkynyl groups. The composition can optionally include a plasticizing additive.

The compositions of the present disclosure can be used to make composite materials that are transmissive (e.g., transparent or translucent) to radiation in both the visible and infrared spectrums. This can solve the problem of a lack of such materials that are capable of being formed into complex curved shapes and/or displaying the mechanical durability to meet environmental challenges experienced on many vehicles. The compositions and composites of the present disclosure are not limited to use in vehicles. Rather, they can be used in any desired application, such as known applications or applications developed in the future for visually transparent or translucent materials and/or IR transparent materials.

In an example, one or more of the following provisos apply to the compositions of the present disclosure: If the at least one additional monomer is either a) a terminally unsaturated hydrocarbon monomer that is not a polymer having 12 carbon atoms or more, or b) a silane monomer, then the thiol terminated hydrocarbon monomer includes a saturated hydrocarbon ring with two or more terminal thiol groups attached to the hydrocarbon ring; if the terminally unsaturated hydrocarbon monomer is polybutadiene, the polybutadiene contains from about 0 mol % to about 30 mol % of polymer units in the cis-1,4-butadiene form; and if the at least one additional monomer is an isocyanate functionalized hydrocarbon monomer, then a ratio of the molecular mass of the thiol terminated hydrocarbon monomer to the number of sulfur atoms in the thiol terminated hydrocarbon monomer ranges from 65 to 500.

In order to realize the combined properties of high visual and IR transparency with rigid, environmentally durable mechanical properties, the sulfur containing copolymers of the present disclosure were chosen as the matrix material of the present compositions. This class of rigid, visually transparent polymers demonstrates reduced absorption in both mid and long wave IR bands compared to many other engineering plastics. The copolymers act as the matrix component of the composite material. In addition to toughness and visual transparency, the copolymers are combined with select inorganic materials, described herein as particulate filler, to exploit their visual and IR transmissive properties. This composite structure is able to mitigate the environmental limitations of the particulate filler (brittleness, water absorption) through dispersal and encapsulation in a continuous polymeric matrix that itself possesses high visual and IR transparency relative to commercially available materials. In addition, the copolymers employed as the polymeric matrix are thermoplastic polymers, which allow for shaping or molding through thermoforming of the material over complex, conformal surfaces. Many conventional transparent materials are difficult or impossible to shape in such a way.

The thiol terminated hydrocarbon monomers employed to make the sulfur containing copolymers of the present disclosure can be substituted or unsubstituted, linear, branched or cyclic $C_3$ to $C_{36}$ saturated hydrocarbons having two or more terminal thiol groups. Examples of suitable thiol terminated hydrocarbon monomers include at least one compound chosen from the compounds of formulae 1 and 2:

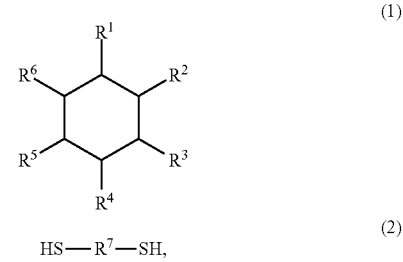

With respect to formula 1: $R^1$, $R^2$, $R^3$, $R^4$, $R^5$, and $R^6$ are independently chosen from hydrogen, —SH and —R'SH, where R' is a $C_1$ to $C_{10}$ hydrocarbon bridge, with the proviso that at least two of $R^1$, $R^2$, $R^3$, $R^4$, $R^5$, and $R^6$ are not hydrogen. In an example, three or four of $R^1$, $R^2$, $R^3$, $R^4$, $R^5$, and $R^6$ are not hydrogen. In another example, R' is a $C_2$ to $C_4$ hydrocarbon bridge, such as an ethyl bridge. Specific examples of the compounds of formula 1 include 2-[2,4-bis (2-mercaptoethyl) cyclohexyl]ethanethiol and 2-[3,5-bis(2-mercaptoethyl)cyclohexyl]ethanethiol. With respect to formula 2, $R^7$ is a $C_2$ to $C_{10}$ hydrocarbon bridge, such as a $C_4$ to $C_8$ hydrocarbon bridge.

As set forth in the provisos above, where the at least one additional monomer is an isocyanate functionalized hydrocarbon monomer, the molecular mass per sulfur atom of the thiol terminated hydrocarbon monomer ranges from 65 to 500 daltons. The molecular mass per sulfur atom of the thiol monomer is not so limited where monomers other than isocyanates are employed. However, in an alternative example, even where no isocyanate monomer is employed to make the copolymers, the molecular mass per sulfur atom of the thiol terminated hydrocarbon monomer can range from 65 to 500, such as about 70 to about 400 or about 75 to about 300 or about 80 to about 250, regardless of what additional monomers are employed.

Examples of suitable terminally unsaturated hydrocarbon monomers for making the copolymers of the present disclosure include substituted or unsubstituted, linear, branched or cyclic $C_3$ to $C_{36}$ hydrocarbons that are internally saturated and have two or more terminal vinyl or alkynyl groups. For example, the hydrocarbon monomer can be a compound of formulae of 3, 4, 5, or 6:

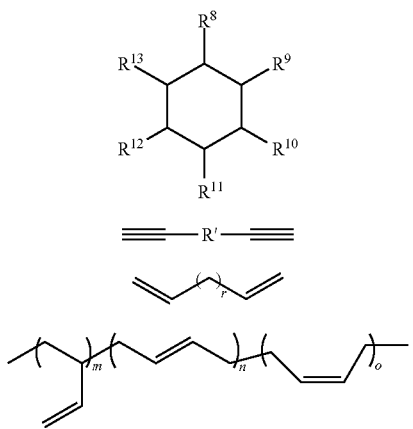

where:
$R^8$, $R^9$, $R^{10}$, $R^{11}$, $R^{12}$, and $R^{13}$ are independently chosen from hydrogen and alkenyl substituents having a terminal vinyl group, where at least two of $R^8$, $R^9$, $R^{10}$, $R^{11}$, $R^{12}$, and $R^{13}$ are not hydrogen;
R' is a $C_2$ to $C_{10}$ hydrocarbon bridge;
r is an integer ranging from 1 to 10;
m ranges from about 70 mol % to about 90 mol %;
n is 0 mol % to about 30 mol %;
o is 0 mol % to about 30 mol %; and
n+o is about 10 mol % to about 30 mol %.

formula 6 above shows a polybutadiene as one example of a terminally unsaturated hydrocarbon monomer. In an example, the weight average molecular weight of the polybutadiene polymers of formula 6 can range from about 1400 to about 5200 g/mol. As can be seen from the values of m, n and o, the polybutadiene contains from about 0 mol % to about 30 mol % of polymer units in the trans-1,4-butadiene form (as indicated by 'n') and from about 0 mol % to about 30 mol % of polymer units in the cis-1,4-butadiene form (as indicated by 'o'). The polybutadiene contains a majority of units that result in a terminal vinyl branch group on the polymer (about 70 mol % to about 90 mol %).

In an example, the interior of the precursor materials, such as the interior of any of the hydrocarbon monomers of formulae 3, 4, or 5 discussed above, and/or the hydrocarbon moieties of the thiols and thiocyanates, contain only saturated hydrocarbon species. This can help ensure that the entire polymeric backbone produces the desired IR transparency. The term "interior" here refers to all but terminal atom positions and the bonds attaching the terminal atoms to the monomer.

Suitable isocyanate functionalized hydrocarbon monomers for making the copolymers of the present disclosure include substituted or unsubstituted, linear, branched or cyclic $C_3$ to $C_{36}$ saturated hydrocarbon monomers having two or more terminal isocyanate groups. For example, the isocyanate functionalized hydrocarbon monomer can be a compound of formulae 7 or 8:

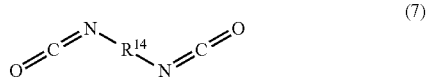

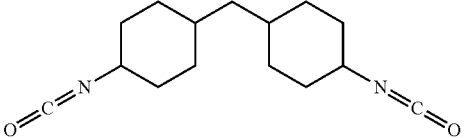

where $R^{14}$ is a $C_3$ to $C_{12}$ n-alkyl bridge. In another example, $R^{14}$ is a $C_4$ to $C_8$ n-alkyl bridge, such as an n-hexyl bridge.

Examples of suitable silane monomers substituted with two or more $C_2$ to $C_8$ terminally unsaturated alkenyl groups or $C_2$ to $C_8$ terminally unsaturated alkynyl groups include any monomers of formula 9:

where $R^{20}$, $R^{21}$, $R^{22}$, and $R^{23}$ can be independently chosen from hydrogen, $C_2$ to $C_8$ terminally unsaturated alkenyl groups and $C_2$ to $C_8$ terminally unsaturated alkynyl groups, where two, three or all four of the $R^{20}$, $R^{21}$, $R^{22}$, and $R^{23}$ are not hydrogen. In an example the alkenyl groups and alkynyl groups are straight hydrocarbon chain groups each have only one double or triple bond that is positioned at the terminal carbon with no internal unsaturation. In an example, the substituted silane monomer can be, for example, tetravinylsilane or tetraallylsilane.

When making the copolymers of the present disclosure, as discussed in the provisos above, if the at least one additional monomer is either 1) a terminally unsaturated hydrocarbon monomer that is not a polymer having 12 carbon atoms or more, such as would be the case for formulae 3 to 5, or 2) a silane monomer, as would be the case for the compounds of formula 9, then the thiol terminated hydrocarbon monomer includes a saturated hydrocarbon ring with two or more terminal thiol groups attached to the hydrocarbon ring, such as the compounds of formula 1 above. Alternatively, if the at least one additional monomer is a terminally unsaturated hydrocarbon monomer that is a polymer having 12 carbon atoms or more, such as would be the case for the compounds of formula 6, or is an isocyanate functionalized hydrocarbon monomer, then any of the thiol terminated hydrocarbon monomers disclosed herein, such as those of formulae 1 and 2, can be used.

The sulfur containing copolymers of the present disclosure can be made by combining so as to react at least one of the thiol terminated hydrocarbon monomers and at least one of the additional monomers. Any of the thiol terminated hydrocarbon monomers, terminally unsaturated hydrocarbon monomers, isocyanate functionalized hydrocarbon monomer and substituted silane monomers disclosed herein can be employed as reactants to form the sulfur containing copolymers.

Where the at least one additional monomer is the hydrocarbon monomer or a substituted silane monomer, polymerization can be carried out with either free radical UV initiators or through high intensity UV light alone. Thus, the reaction process can include exposing the monomer mixture to ultraviolet light. Examples of the general reactions can be illustrated as follows:

where "A" is any of the thiol terminated hydrocarbon monomers disclosed herein; "B" is any of the terminally unsaturated hydrocarbon monomer disclosed herein; "C" is any of the silane monomers substituted with two or more $C_2$ to $C_8$ terminally unsaturated alkenyl groups or $C_2$ to $C_8$ terminally unsaturated alkynyl groups, as described herein; A', B', and C' are the corresponding polymer units respectively formed from monomers A, B, and C during the polymeric reaction; and the values for x and y each range from about 0.3 to about 0.7, where x+y=1.

Where the at least one additional monomer is an isocyanate functionalized hydrocarbon monomer, the reaction process can include adding a catalyst to the mixture. Examples of suitable catalysts include base catalysts such as amines (e.g., tertiary amines), or metal salt species (e.g., Dibutyltin dilaurate and homologous thereof, as well as other Sn salt compounds). Examples of the general reactions can be illustrated as follows:

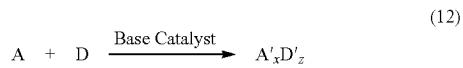

Where "A" is any of the thiol terminated hydrocarbon monomers disclosed herein; "D" is any of the isocyanate functionalized hydrocarbon monomers disclosed herein; A' and D' are the corresponding polymer units respectively formed from monomers A and D during the polymeric reaction; and the values for x and z each range from about 0.3 to about 0.7, where x+z=1. The product $A'_xD'_z$ includes one or more thiocarbamate moieties.

In an example, the polymeric materials made according to the principles of the present disclosure comprise saturated hydrocarbons moieties, with optional silicon atoms incorporated into the hydrocarbon backbone if silane reactants are employed, and one or more heteroatom containing moieties chosen from thioether linkages and thiocarbamate linkages. In an example, it is desirable that the linkages in the copolymer are only thioether linkages and/or thiocarbmatate linkages, assuming conversion of monomer reactants to the polymer product was complete. In actuality, however, the polymer reaction may often not be entirely complete, side reactions may occur and/or the reactant monomers may contain residual impurities, so that other unintended bond structures may be included in the polymer. For example, it is expected that a certain amount of unreacted thiol and isocyanate functional groups from the monomer reactants may be included in the product.

That said, it is desirable to keep bond structures that absorb radiation in the visual spectrum or in the IR wavelength ranges of about 4 to about 12 microns at sufficiently low concentrations so as to maintain a desired level of transparency, since increasing the density of these absorptive bonds in the polymer will begin to progressively absorb more and more light and thereby reduce transparency. Examples of unwanted moieties that contain light absorbing bond structures include esters, carboxylic groups, carbonyl groups, ketones, ethers, carbon-halogen bonds, and aromatic species. The amounts of these groups that can be included in the materials without undesirably effecting transparency may vary depending on the radiation absorbing properties of each of the groups. In an example, the copolymers of the present disclosure contain none, or substantially none, of any one of esters, carboxylic groups, carbonyl groups, ketones, ethers, carbon-halogen bonds, aromatic moieties, or thiosulfonato groups. The precise amounts of any residual concentrations of these moieties in the copolymers of the present disclosure may be difficult to determine. Thus, the term "substantially none" is defined herein to mean that the monomer reactants are chosen to avoid formation of these unwanted moieties (e.g., that any such moieties that are formed do so as a result of chemical impurities in the reactants and/or unwanted side reactions and so forth).

The copolymers of the present disclosure can be relatively large molecules, such as macromolecules. These molecules are crosslinked to the point that they create a percolating network or a network that effectively is crosslinked to the point that the entire macroscopic piece is a single molecule. Further, the molecular weight of a single copolymer and/or the number of copolymers contained in an amount of bulk polymeric material formed by the processes of the present disclosure can be difficult or impossible to determine. The term "bulk polymeric material" is defined to mean, for purposes of this disclosure, a polymeric product made by the processes of the present disclosure that has been dried to remove any solvents.

In an example, the monomer reactants used to make the copolymers of the present disclosure are limited to only those disclosed herein. For example, the thiol terminated hydrocarbon monomer and the at least one additional monomer, such as a terminally unsaturated hydrocarbon monomer, an isocyanate functionalized hydrocarbon monomer; and a silane monomer substituted with two or more $C_2$ to $C_8$ terminally unsaturated alkenyl groups or $C_2$ to $C_8$ terminally unsaturated alkynyl groups, as disclosed herein, are the only monomers reacted to form the copolymers of the present disclosure, with the exception of any residual monomer impurities introduced with the reactants. One technique for achieving the desired transparency is to employ monomers with a high degree of purity so as to reduce unwanted light absorbing bond structures. In an example, each of the monomer reactants have a purity of 95 weight % or more, such as 97 weight % or 98 weight % or more.

The copolymers of the present disclosure are amorphous (e.g, having little or no crystallinity), which increases visual transparency. The low crystallinity is a result of the polymer units being arranged randomly in the copolymer structure. Also, as mentioned above, for purposes of IR transparency the sulfur containing copolymer product can be saturated. Alternatively, the sulfur containing copolymers can include some internal unsaturation, such as where the polybutyldiene polymers discussed above are used as the at least one additional monomer.

The sulfur containing copolymer matrix materials employed in the composites of the present disclosure are transmissive (e.g., transparent or translucent) in the visual spectrum (e.g., 390 nm to 700 nm) and IR wavelength ranges of about 4 microns to 12 microns. These sulfur containing polymers include 1) thiolenes produced by the reaction of a thiols and terminal vinyl functional groups; and 2) thiocarbamates produced through a reaction of thiol groups and isocyanates. The C—S linkages for these compounds formed upon polymerization do not display significant absorption bands in ranges of interest to common IR cameras. The polymeric materials can be linear polymers, branched polymers or a crosslinked polymer network.

The thiocarbamates provide good rigidity and relatively high glass transition temperatures compared to the thiolenes describe above, but at the expense of a higher IR absorption in the long wave region. These thiocarbamate polymers may be suitable for application as ophthalmic lenses, among other things.

Particulate fillers for use in the compositions of the present disclosure are selected to be in the nanoparticle size range and preferably exhibit high IR transparency and small particle size relative to incident radiation wavelength in order to increase IR transparency and limit scattering in both IR and visible wavelength ranges. In particular, the particulate filler material can be chosen so as to be transparent in the visual band and IR band (e.g., 4-12 µm). Beyond this, the material chosen is preferably not hygroscopic to avoid absorption of IR opaque moisture or dissolution of particles.

The particulate filler has a particle size of less than 250 nm to reduce extinction of light due to scattering effects. Thus, the particulate filler has an average discrete particle size ranging from, for example, about 10 nm to about 250 nm. In another example, the average discrete particle size can range from about 15 nm to about 100 nm or 150 nm, such as about 20 nm to about 40 nm. The term particle size as used herein refers to discrete, individual particles rather than aggregates and is measured through direct imaging with Transmission Electron Microscopy (TEM).

Suitable particulate fillers include at least one material chosen from, for example, germanium, $CaF_2$, NaCl, KCl, KBr, diamond, Si, Csl, MgO, $MgF_2$, LiF, $BaF_2$, Thallium Bromoiodide (ThBrl), and Thallium Bromochloride (ThBrCl) in a nanoparticle morphology size range. Any suitable techniques for making the particles can be employed, such as liquid or gas phase synthesis. In an example, the particle filler is $BaF_2$. In an example, the particle fillers are IR transparent.

The particulate fillers can include one or more ligands attached thereto. Homogenous incorporation of nanoparticle filler into the copolymer matrix material is dependent on particle surface character. Due to the non-polar nature of the copolymer material and polar composition of many of the particulate filler materials, a natural incompatibility can exist that may result in aggregation of the particles and/or separation of the particles from the copolymer matrix material. One method for overcoming this problem is to include ligands on the particle surface. In one example, this can be accomplished by forming the particles, such as $BaF_2$ particles, in situ within a solvent medium where they can be coated upon formation with a non-polar ligand shell. The ligands formed in this manner can reduce particle aggregation and allow for improved dispersion of the particles into the copolymer matrix material compared to the same particles formed without the ligands. Example techniques that can be used for forming particles with ligands are described in more detail in an article by Mai et al. entitled, "High quality Sodium rare-earth fluoride nanocrystals: Controlled synthesis and optical properties", *J. Am. Chem. Soc.*, 2006, 128 (19), pp 6426-6436. Any other suitable techniques for forming particles with ligands may also be employed. Given the teachings of the present disclosure, making $BaF_2$ particles having suitable ligands attached to the surface would be within the ordinary skill of the art.

Ligand shell character can be chosen so as not to minimize absorption bands in selected regions of desired IR transparency (4-12 µm). One of the few ligands that meet these requirements are thiols having a hydrocarbon moeity (e.g., —RSH, where R is a saturated or unsaturated, linear, branched or cyclic hydrocarbon). Examples of suitable thiol ligands include alkyl thiols and aryl thiols. Candidates for alkane thiol and aryl thiol ligands include but are not limited to: dodecanethiol, hexanethiol, octanethiol, decanethiol, octadecanethiol, cyclohexanethiol, cyclopentanethiol, benzene mercaptan, and benzyl mercaptan ligands. Alkane thiol ligands and techniques for making particles with these ligands are generally known in the art for certain particulates, such as ZnS. Other possible ligands include saturated and unsaturated alkyl amines, such as oleyl amine, and saturated and unsaturated alkyl carboxylic acids such as oleic acid.

The particulate fillers of the present disclosure are uniformly dispersed throughout the copolymer matrix to form the composite, so that the majority (e.g., greater than 50% by weight, such as 80%, 90% or 95% more) of the particular filler is completely surrounded by copolymer matrix. The particulate fillers in the compositions of the present disclosure can be in any suitable amount. Examples include amounts ranging from about 5% by weight to about 95% by weight, such as about 10% by weight to about 95% by weight, 25% by weight to about 95% by weight or about 30% by weight to about 95% by weight, based on the total dry weight of the composition (weight of composition minus the solvent), or the total weight of the composite for dried composites. IR absorption is generally expected to drop and transparency improve with increased filler concentration.

Plasticizing additives are optionally included in the compositions of the present disclosure. Any suitable plasticizing additive can be employed. For example, the plasticizing additive can be at least one compound chosen from an unsaturated hydrocarbon and a copolymer of ethylene and propylene. The plasticizing additive does not react or chemically bond with the copolymer, but rather remains intimately mixed with the polymer after processing, which may include, for example, hot pressing, spray coating or other film forming techniques.

Any suitable solvent can be employed. The purpose of the solvent is to solubilize copolymer matrix and disperse particulate filler. Examples of suitable solvents include: Xylenes, Toluene, Cyclohexane, and mixtures thereof. Solids concentration in the wet compositions of the present disclosure can range from about 5% by weight to about 50% by weight, with the solvent concentration ranging from about 50% by weight to about 95% by weight, relative to the total weight of the composition.

The composition comprising a solvent as described herein can be mixed and/or stored in a liquid form. The liquid composition can be deposited and dried to form a solid composite. The dried composite includes copolymer matrix and the above described particulate fillers dispersed in the matrix, as well as optional plasticizer, if employed. The composite can be transmissive at the desired wavelengths (e.g., translucent or transparent at one or more visual wavelengths and and/or transparent at one or more infrared wavelengths).

The present disclosure is also directed to a method of making a transmissive composite panel using the compositions of the present disclosure. Referring to FIGS. 1A to 1D, the method comprises depositing a layer 2 of a composite mixture on a substrate 1, the composite mixture comprising a) a sulfur containing copolymer, b) a particulate filler, c) an optional plasticizing additive, and d) a solvent. Substrate 1 can be made from a transparent material, such as a polycarbonate. Alternatively, substrate 1 can be made from a material that is not transparent. Any suitable technique can be used to deposit the layers 2. For example, the deposition can be performed by either spray coating or casting. Other liquid deposition techniques can also be employed.

The deposited layer 2 is dried. A top view of a deposited layer 2 comprising a sulfur containing copolymer matrix 4 having particulate filler 6 dispersed therein is shown in FIG. 1A. The dried layer 2 is optionally removed from the substrate 1. The depositing and drying to form each individual layer 2 and the optional removing steps are repeated one or more times to provide a film 8 with a desired thickness.

Figure 1C:

If the individual dried layers 2 are removed from the substrate after each drying step, the resulting freestanding dried films can be stacked to form a thin film stack 8 of multiple layers 2 to a desired thickness, as shown in FIG. 1C. Then the thin film stack 8 is heated at a desired annealing temperature and annealing pressure to consolidate the film stack into a single composite layer. The annealing temperature can be any suitable temperature. For example the temperature can range from about 80° C. to about 160° C. The annealing pressure can be any suitable pressure, such as, for example, from about 50 psi to 5000 psi. In this manner, the multiple dried layers 2 can be stacked and consolidated to form a free standing film 8 that does not include an additional transparent substrate.

Optionally, the dried layers 2 can be stacked on a second, transparent substrate (not shown), such as a polycarbonate or any other suitable substrate, that can become part of the stack. In this manner, the multiple dried layers 2 can be stacked and consolidated with the transparent substrate.

Alternatively, if the individual layers 2 are not removed after each drying step, the deposited layers can steadily build up the film to any desired film thickness on the substrate 1 on which the film is deposited. Since depositing the layers together may result in sufficient adhesion between the separately deposited layer thicknesses without further processing, it may or may not be desired to carry out the final anneal at elevated temperatures and/or pressures. After the desired thickness is achieved, the film can optionally be removed from substrate 1.

Figure 1D:
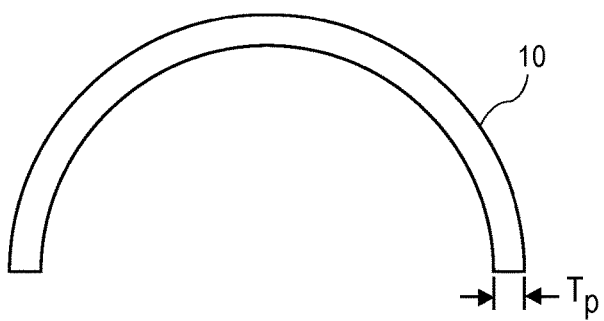
Figure 2:
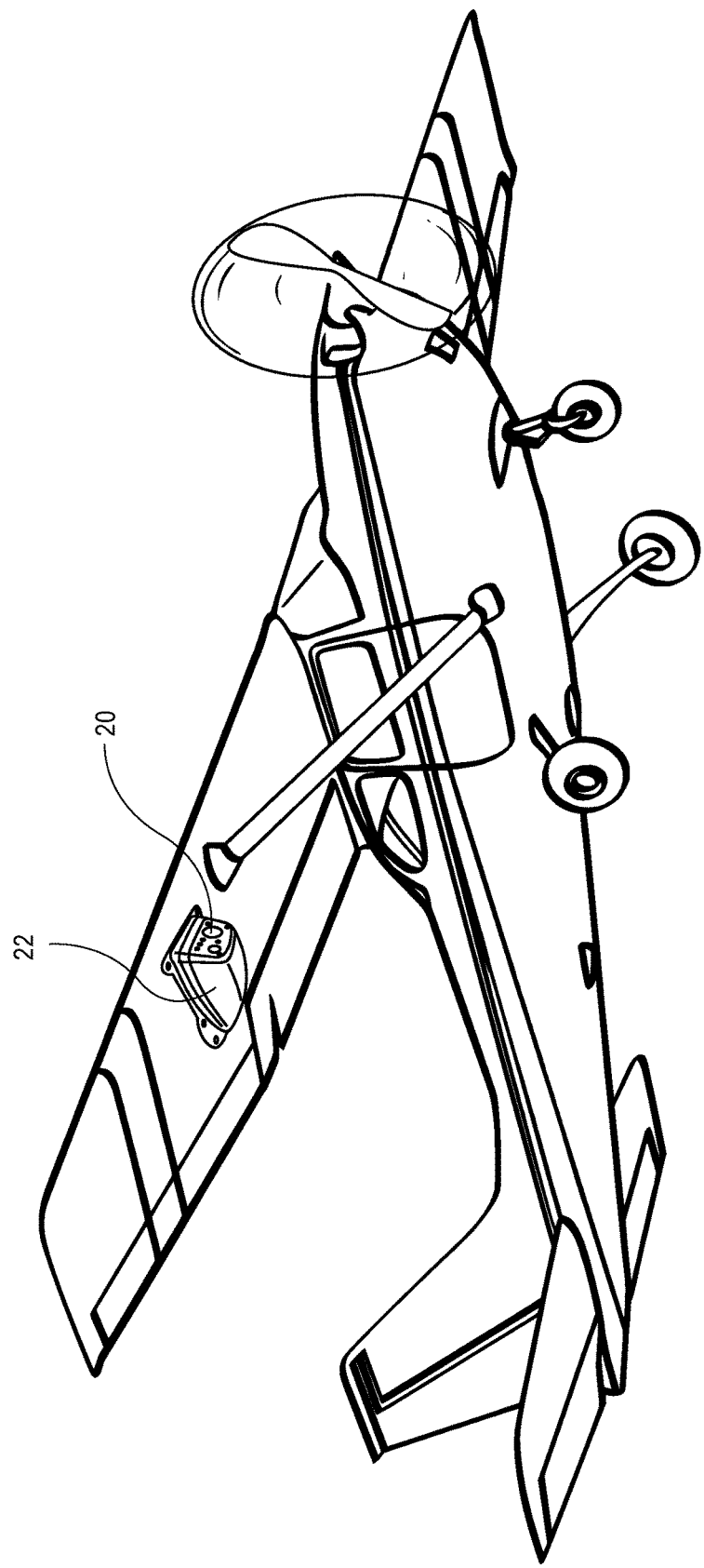
FIG. 2 illustrates a transparent covering for an infrared camera on a vehicle, according to an aspect of the present disclosure It should be noted that some details of the figures have been simplified and are drawn to facilitate understanding rather than to maintain strict structural accuracy, detail, and scale.

The resulting free standing film or the film formed or stacked on the optional substrate can subsequently be molded or formed to any desired shape. FIG. 1D shows an example of a resulting transmissive composite in the form of a free-standing panel 10 that has been molded to a desired shape. The panel can have any desired shape and thickness, $T_p$. Thicknesses can range, for example, from about 5 microns to about 1 mm, such as about 50 microns to about 250 microns. The panel can be transmissive at the desired wavelengths (e.g., translucent or transparent at one or more visual wavelengths and and/or transparent at one or more infrared wavelengths). The composite can be used for any suitable application in which visual and/or IR transmissive materials are desirable. One example of such an application is as a window or other transparent covering, such as a lense cover 20, for an infrared camera 22 positioned on a vehicle.

In an example, the composite panels display broadband transparency across both visual and portions of the infrared (such as, for example, the 4-12 micron region). In another example, the panel is transparent to visible radiation and IR radiation having wavelengths ranging from about 400 nm to about 12 microns.

In addition to the ability to transmit radiation at the disclosed wavelengths (e.g., transparency or translucency), the material properties of the panels include one or more of: an environmental robustness with rigidity (e.g., Storage Modulus ranging from about 0.25 GPa to about 10 GPa, such as greater than 0.5 GPa, or greater than 2 GPa), heat resistance (e.g., $T_g$ ranging from about 25° C. to about 350° C., such as about 120° C. to about 350° C.), or resistance to impact and cracking due to the polymeric component of the composite (e.g., impact strength ranging from about 0.3 ft-lb/inch to about 3 ft-lb/inch, as measured, for example, using the IZOD impact strength test. Storage Modulus values can be determined by DMA (Dynamic Mechanical Analysis) on TA Instruments Q-800. Due to the polymeric nature of the composite, the material can be shaped or molded to complex curved surfaces. Such material performance is unique in a free standing panel.

In order to successfully design windows that display both visible and IR transparency it is helpful to understand the factors that reduce transparency in general, which include absorption and scattering. Absorption in the visible spectrum is frequently governed by electronic band structure. A minimum requirement for visual transparency is a band gap of energy greater than the highest energy wavelength in the visible spectrum. Absorption in the IR spectrum is dominated by the interaction of electromagnetic radiation with bonds between atoms giving rise to vibration and rotations leading to characteristic absorption frequencies.

In addition, scattering of visible and IR wavelengths in the bulk of a material is governed by changes in the index of refraction through the medium. Variations in index at length scales near the wavelength of the propagating radiation will tend to scatter those wavelengths more effectively (Mie scattering). As a result, for materials transparent to both visible and IR radiation, it is desirable to have index of refraction variation in the material below the shortest wavelength of propagating radiation. For example, this could be about 400 nm (the short end of the visible spectrum), which corresponds to length scales of less than about 150 nm and preferably <50 nm.

Finally the surface properties of a material will also influence scattering properties. If the material shows a surface roughness on the length scale of incident radiation, this will strongly promote diffuse scattering of light at the surface, also reducing transmission and transparency. As a result, it is desirable for windows to be both smooth and compositionally homogeneous at length scales at or above the wavelengths of interest.

Composites formed using compositions of the present disclosure can have greater than 70% average, regular transmission, such as an average, regular transmission of 70% to 99%, where incident radiation is normal (perpendicular) to the panel surface and where average transmission is determined across a wavelength band of 400 nm to 700 nm and for panel thicknesses ranging from 0.001 inch (1 mil) to 0.050 inch (50 mil). As an example of a transmission value for a given wavelength and thickness, the transparent composite can have a greater than 70% transmission, where the incident radiation is normal to the surface and has a wavelength of 500 nm at a composite thickness of 0.001 inch. Transmission is calculated as I(t)/Io at a given panel thickness as determined, for example, using a Perkin Elmer UV/VIS spectrometer, where Io is the incident intensity and I(t) is the intensity as a function of thickness. It is noted that one of ordinary skill in the art would understand that transmission generally can include regular transmission and diffuse transmission, both of which can contribute to total transmission. The average visual transmission values in the present application include only regular transmission.

Transmission characteristics in the infrared range can be quantified as absorption coefficient values. For example, the composites can have an average absorption coefficient of less than $\alpha = 75$ $cm^{-1}$ at wavelengths between 8000 nm to 12000 nm. The absorption coefficient can be determined using the following relationship:

$$\alpha = \frac{4\pi k}{\lambda}$$
$$\text{Complex index of refraction} = n + ik$$

where $\alpha$ is the absorption coefficient, $\lambda$ is the wavelength, and k is the imaginary portion of the complex index of refraction (n+ik). Both reflectance and transmission values for determining absorption coefficient at infrared wavelengths of 2.5 microns to 25 microns were collected using an SOC-100 Hemispherical Directional Reflectometer. The reflection and transmission values were used to determine the complex refractive index of the material using the Kramers-Kronig relationship. From the k value of the complex refractive index, the absorption coefficient (intrinsic attenuation within the material measured in per cm) was calculated. For each wavelength measured within the SOC-100, an alpha value was determined. From these values an average alpha value was calculated for the infrared waveband of 8000 nm to 12000 nm. For example, alpha values can be determined at 1000 nm increments from 8000 nm to 12000 nm and the values averaged to arrive at an average absorption coefficient.

In an example, the composites and IR transmissive windows of the present disclosure do not include significant amounts of silicone based materials, or polymers or other materials that are not transparent to IR, such as polycarbonate, polystyrene, Teflon, polyethylene, and polypropylene. The term "significant amounts" as used herein is defined to mean 1% by weight or more (e.g., 1% to 100% by weight). In examples, the composites can contain less than 0.5% by weight or 0.01% by weight or less (e.g., 0.5% to 0% by weight), such as none, of the materials listed in this paragraph.

In an example, no other ingredients are added to the compositions of the present disclosure except for the disclosed monomers; one or more of the presently disclosed particulate fillers (e.g., IR transparent fillers) dispersed in the sulfur containing copolymer and optionally a solvent and/or plasticizing additive, as described herein. In an example, the dried composites, such as the panels, of the present disclosure do not include any other components except for: a sulfur containing copolymer matrix as formed by reaction of the disclosed monomers and any non-reacted monomers and/or unintended residual products formed by reaction of the monomers; one or more IR transparent particulate fillers dispersed in the sulfur containing copolymer and optionally a plasticizing additive and/or residual solvent, as described herein. Alternatively, the compositions and composites can include one or more additional ingredients other than those described herein, where the additional ingredients do not substantially affect the desired visual and/or IR transmissive qualities (e.g., transparency or translucency) of the resulting films.

EXAMPLES

Example 1

Synthesis of Thiolene Film Composed of 1,2,4-trivinylcyclohexane and 1,6-hexanedithiol 1,2,4-Trivinylcyclohexane (0.2 g, 1.23 mmol) and 1,6-hexandithiol (0.28 g, 1.85 mmol) were combined and vortexed well. A photoinitiator such as 2,2-Dimethoxy-2-phenylacetophenone (DMPA) was added in a small amount (0.025 wt %) for faster curing of the film. The thiolene mixture was placed between two glass slides (75 mm×50 mm; thickness 1 mm) with a Teflon spacer (0.13 mm thick) and fastened with clips. The film was exposed to UV (H bulb (5×60 sec)) on three occasions. The film was carefully removed from the glass slides to give a clear film.

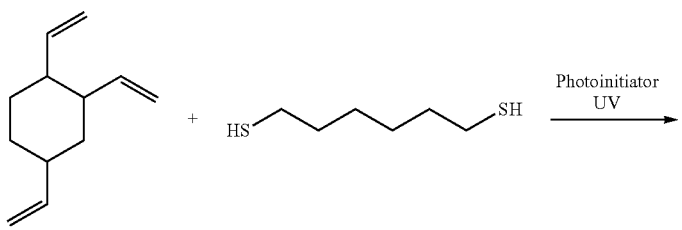

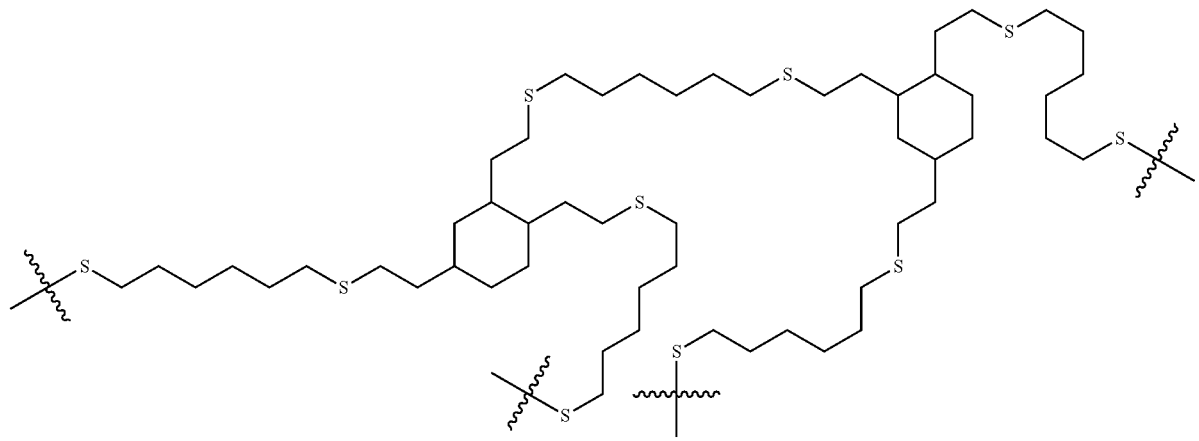

Example 2

Synthesis of thiocarbamate Film Composed of 4,4'-methylenebis(4-cyclohexylisocyanate) (HMDI) and 2-[2,4-bis(2-mercaptoethyl)cyclohexyl]ethanthiol 2-[2,4-bis(2-mercaptoethyl)cyclohexyl]ethanthiol (0.150 g, 0.57 mmol; synthesized previously) and 4,4'-methylenebis(4-cyclohexylisocyanate) (0.225 g, 0.86 mmol, Sigma Aldrich) were combined and vortexed well. To the mixture, tetrahydrofuran (937 μL) was added and the mixture vortexed again. For the reaction to proceed, triethylamine dispersed in tetrahydrofuran was added to the vial (187 μL, 1% triethylamine in tetrahydrofuran). The film was prepared by drop casting the solution onto a glass substrate and covering the substrate with a glass dish slowly allowing the solvent to evaporate leaving a clear film.

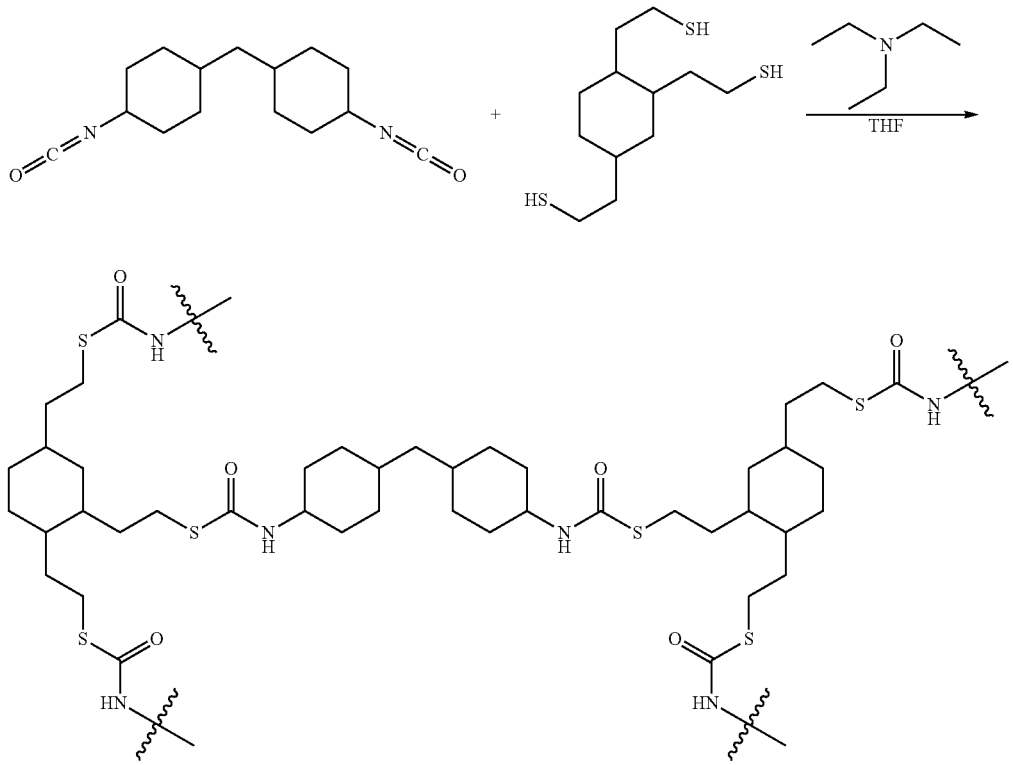

Example 3

Synthesis of thiocarbamate Film Composed of 1,6-diisocyanatohexane (HDI) and 2-[2,4-bis(2-mercaptoethyl)cyclohexyl]ethanethiol 2-[2,4-bis(2-mercaptoethyl)cyclohexyl]ethanethiol (0.100 g, 0.38 mmol; synthesized previously) and 1,6-diisocyanatohexane (0.095 g, 0.57 mmol, Sigma Aldrich) were combined and vortexed well. To the mixture, tetrahydrofuran (565 µL) was added and the mixture was vortexed again. The catalyst, triethylamine, dispersed in tetrahydrofuran was added to the vial (20 µL, 1% triethylamine in THF). The film was prepared by drop casting the solution onto a glass substrate and allowing the solvent to evaporate leaving a clear film.

Example 4

Synthesis of thiocarbamate Film Composed of 1,6-diisocyanatohexane (HDI), 4,4'-methylenebis(4-cyclohexylisocyanate) (HMDI) and 2-[2,4-bis(2-mercaptoethyl)cyclohexyl]ethanethiol 2-[2,4-bis(2-mercaptoethyl)cyclohexyl]ethanethiol (0.35 g, 1.33 mmol; synthesized previously), 1,6-diisocyanatohexane (0.150 g, 0.89 mmol, Sigma Aldrich) and 4,4'-methylenebis(4-cyclohexylisocyanate) (0.234 g, 0.89 mmol, Sigma Aldrich) were combined and vortexed well. To the mixture, 2-butanone (2.02 mL) was added and the mixture was vortexed again. Triethylamine dispersed in 2-butanone was added to the vial (180 µL, 1% triethylamine in 2-butanone) to catalyze the reaction. The film was prepared by

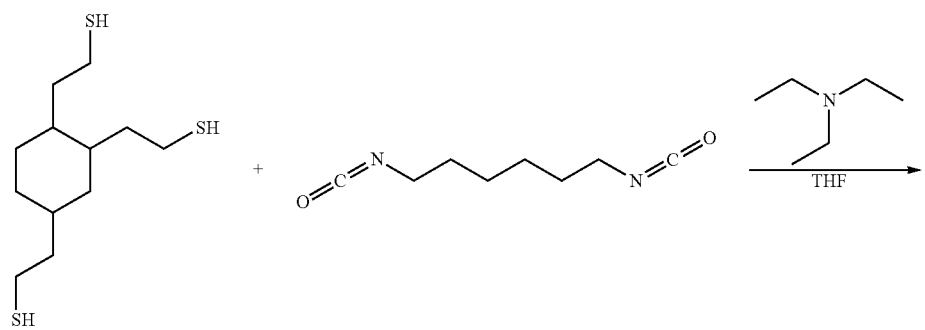

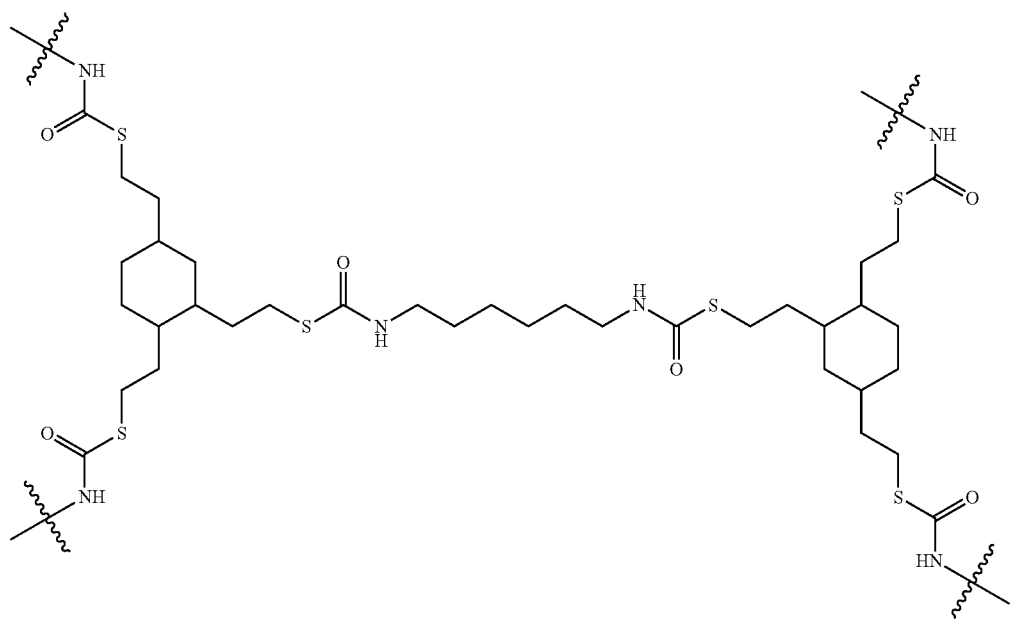

drop casting the solution onto a glass substrate and allowing the solvent to evaporate leaving a clear film.

ously) and tetravinylsilane (0.19 g, 1.39 mmol, Sigma Aldrich) were combined and mixed using a vortex. A

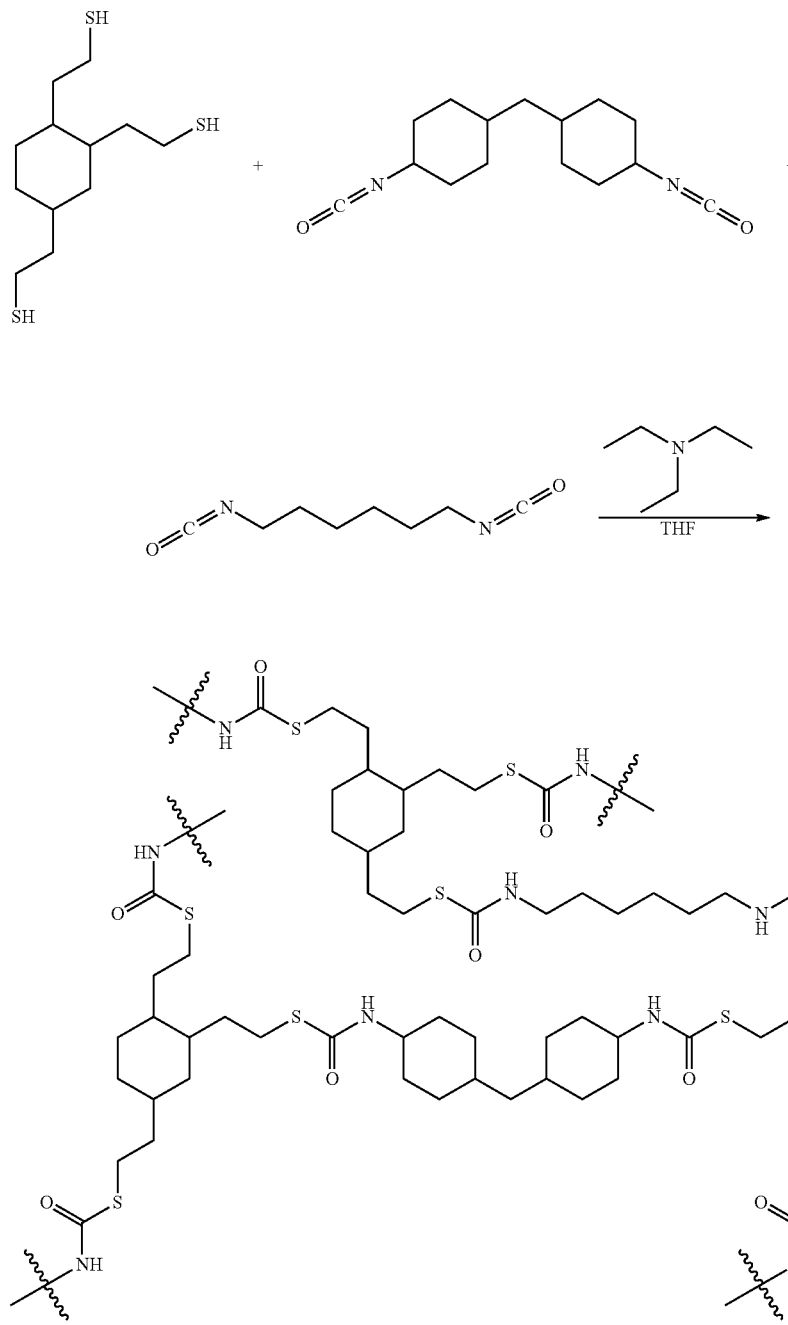

Example 5

Synthesis of thiolene Film Composed of 2-[2,4-bis(2-mercaptoethyl)cyclohexyl]ethanethiol and tetravinylsilane In a scintillation vial, 2-[2,4-bis(2-mercaptoethyl) cyclohexyl]ethanethiol (0.5 g, 1.89 mmol; synthesized previphotoinitiator such as 2,2-Dimethoxy-2-phenylacetophenone (DMPA) can be added in a small amount (0.025 wt %) for faster curing of the film. The thiolene mixture is placed between two glass slides (75 mm×50 mm; thickness 1 mm) with a Teflon spacer (0.13 mm thick) and fastened with clips. The film was exposed to UV (H bulb (5×60 sec)) on three occasions. The film was carefully removed from the glass slides to give a clear film.

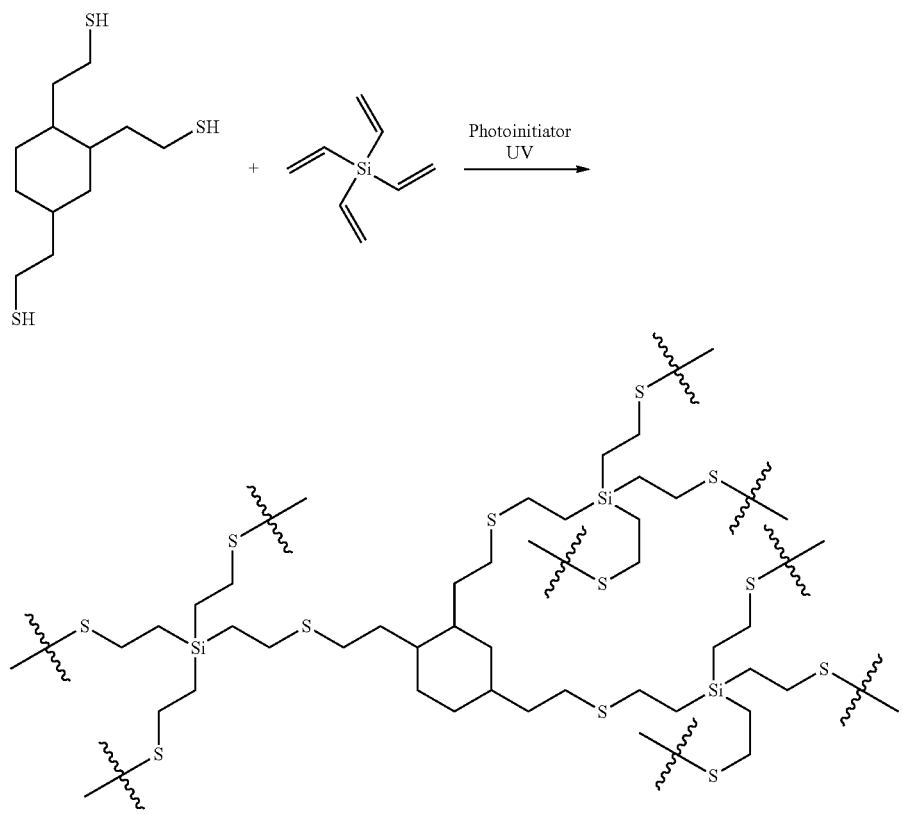

Example 6

Synthesis of thiolene Film Composed of 1,6-hexanedithiol and 1,6-heptadiyne

Hexanedithiol (0.979 g, 6.51 mmol) was combined with 1,6-heptadiyne (0.300 g, 3.26 mmol) and vortexed well. DMPA (0.32 mg) was added and the mixture vortexed again. The mixture was placed between two glass slides (75 mm×50 mm) with a telfon spacer (0.13 mm thick) and fastened by clips. The film was exposed to UV (H2 bulb (5×60 sec)) on three occasions. The film was carefully removed from the glass slides to give a clear film.

Example 7

Synthesis of thiolene Film Composed of 2-[2,4-bis(2-mercaptoethyl)cyclohexyl]ethanethiol and 1,2,4-trivinylcyclohexane 2-[2,4-bis(2-mercaptoethyl)cyclohexyl]ethanethiol (0.614 g, 3.78 mmol) was combined with 1,2,4-trivinylcyclohexane (0.750 g, 3.78 mmol) and vortexed well. DMPA (0.34 mg) was added and the mixture vortexed again. The mixture was placed between two glass slides (75 mm×50 mm) with a telfon spacer (0.13 mm thick) and fastened by clips. The film was exposed to UV (H2 bulb (5×60 sec)) on

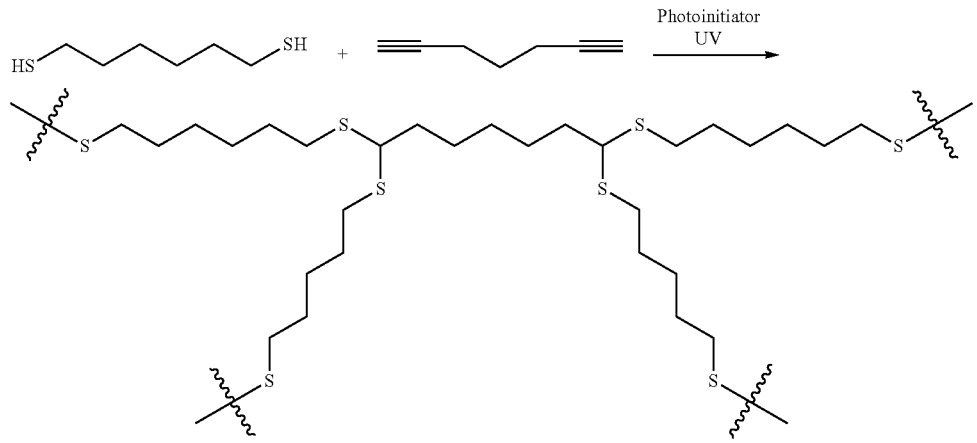

three occasions. The film was carefully removed from the glass slides to give a clear film.

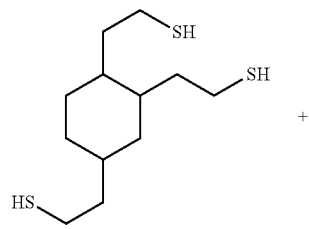

+

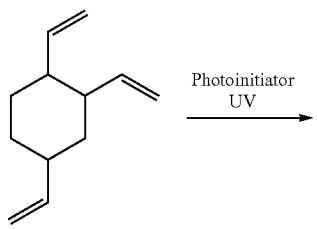

Photoinitiator
UV
→

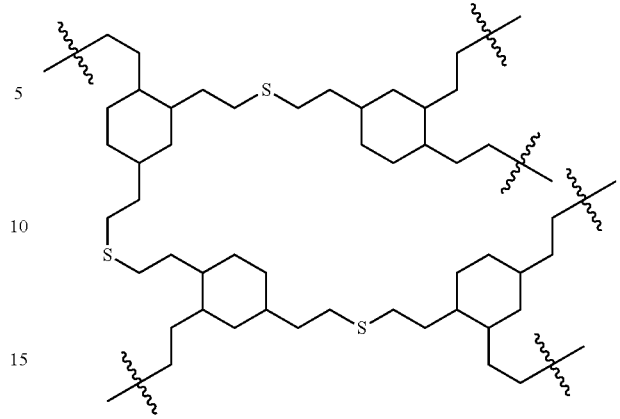

Example 8

Synthesis of thiolene Film Composed of 2-[2,4-bis(2-mercaptoethyl)cyclohexyl]ethanthiol and 1,6-heptadiyne 2-[2,4-bis(2-mercaptoethyl)cyclohexyl]ethanethiol (1.15 g, 4.34 mmol) was combined with 1,6-heptadiyne (0.300 g, 3.26 mmol) and vortexed well. DMPA (0.36 mg) was added and the mixture vortexed again. The mixture was placed between two glass slides (75 mm×50 mm) with a teflon spacer (0.13 mm thick) and fastened by clips. The film was exposed to UV (H2 bulb (5×60 sec)) on three occasions. The film was carefully removed from the glass slides to give a clear film.

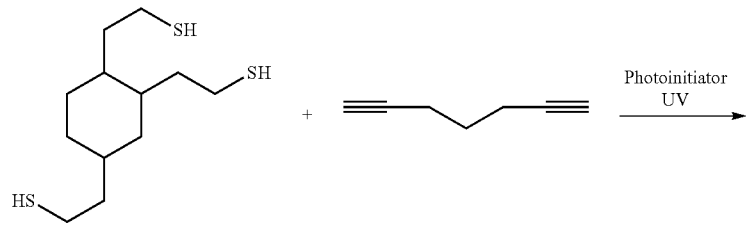

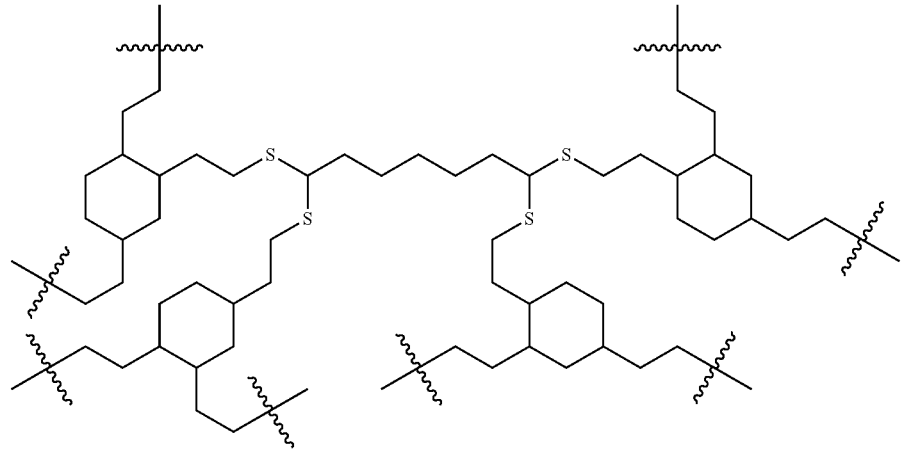

Example 9

Synthesis of thiolene Film Composed of polybutadiene and 1,6-hexanedithiol

Polybutadiene (0.49 g; Mn=2900, 80% Vinyl) was combined with 1,6-hexanedithiol (0.54 g, 3.62 mmol) and vortexed well. A photoinitiator such as 2,2-Dimethoxy-2-phenylacetophenone (DMPA) can be added in a small amount (0.025 wt %) for faster curing of the film. The mixture was placed between two glass slides (75 mm×50 mm) and a Teflon spacer (0.13 mm thick) and fastened by clips. The film was exposed to UV (H bulb (5×60 sec)) on three occasions. The film was carefully removed from the glass slides to give a clear film.

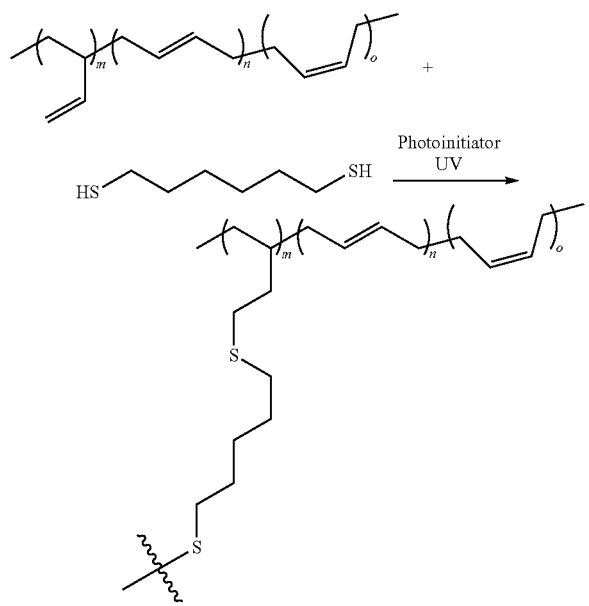

Example 10

Synthesis of Thiolene Film Composed of Polybutadiene and 1,6-Hexanedithiol with 10% (w/w) $BaF_2$ as an Infrared Transparent Filler Polybutadiene (0.24 g; Mn=2900, 90% Vinyl) was combined with barium fluoride ($BaF_2$) nanoparticles having ligands attached thereto to reduce agglomeration (0.056 g) and mixed using a high speed mixer (FlackTek (2300 rpm, 3×60 sec)) on two occasions or until completely mixed. The ligand enhanced barium fluoride particles were obtained from Intelligent Material Solutions, Inc., of Princeton, N.J. 1,6-hexanedithiol (0.27 g, 1.80 mmol) was added to the mixture and vortexed well. A photoinitiator such as 2,2-Dimethoxy-2-phenylacetophenone (DMPA) can be added in a small amount (0.025 wt %) for faster curing of the film. The mixture was placed between two glass slides (75 mm×50 mm) and a Teflon spacer (0.13 mm thick) and fastened by clips. The film was exposed to UV (H bulb @ 2 ft (5×60 sec)) on three occasions. The film was carefully removed from the glass slides to give a translucent film with 89.2% average visible transparency and an average $\alpha$ value=62.6 $cm^{-1}$ for wavelengths ranging from 8 to 12 microns.

The copolymer material of Examples 1-9 above all gave excellent visual transmission at 5 mils thickness. While this was not measured directly it would be estimate at >90%. The IR average absorption coefficient (alpha) of each example copolymer was:
Example 1—$\alpha$=33.3 $cm^{-1}$
Example 2—$\alpha$=125.6 $cm^{-1}$
Example 3—$\alpha$=213.9 $cm^{-1}$
Example 4—$\alpha$=182.2 $cm^{-1}$
Example 5—$\alpha$=100.6 $cm^{-1}$
Example 6—$\alpha$=83.2 $cm^{-1}$
Example 7—$\alpha$=127.7 $cm^{-1}$
Example 8—$\alpha$=131.6 $cm^{-1}$
Example 9—$\alpha$=59.1 $cm^{-1}$.

The average alpha values reported for the material of examples 1 to 9 were determined for wavelengths of 8000 nm to 12000 nm using the same procedure as discussed herein above for determining alpha values. Adding filler to the composite, as discussed herein, can lower alpha to values below those reported for the copolymer matrix material alone. That said, lower alpha values for the matrix polymer can potentially allow for reduced amounts of filler and/or a reduced overall alpha value of the composite. For sulfur polymers without filler, the average alpha can range from 225 or less, such as about 200 to 0 or about 150 to 0.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein.

While the present teachings have been illustrated with respect to one or more implementations, alterations and/or modifications can be made to the illustrated examples without departing from the spirit and scope of the appended claims. In addition, while a particular feature of the present teachings may have been disclosed with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." Further, in the discussion and claims herein, the term "about" indicates that the value listed may be somewhat altered, as long as the alteration does not result in nonconformance of the process or structure to the intended purpose described herein. Finally, "exemplary" indicates the description is used as an example, rather than implying that it is an ideal.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompasses by the following claims.

What is claimed is:
1. A composition, comprising:
a copolymer made from a thiol terminated hydrocarbon monomer and at least one additional monomer chosen from the compounds of i) a terminally unsaturated hydrocarbon monomer, ii) an isocyanate functionalized hydrocarbon monomer and iii) a silane monomer substituted with two or more $C_2$ to $C_8$ terminally unsaturated alkenyl groups or $C_2$ to $C_8$ terminally unsaturated alkynyl groups, the copolymer being transmissive to radiation in at least one of the visual spectrum or the infrared ("IR") wavelength range of about 4 microns to about 12 microns;

a particulate filler dispersed in the copolymer, the particulate filler having an average discrete particle size ranging from about 10 nm to about 250 nm as measured by direct imaging with Transmission Electron Microscopy (TEM); and a solvent, with the proviso that if the terminally unsaturated hydrocarbon monomer is polybutadiene, the polybutadiene contains from about 0 mol % to about 30 mol % of polymer units in a cis-1,4-butadiene form.

2. The composition of claim 1, wherein the at least one additional monomer is the terminally unsaturated hydrocarbon monomer.

3. The composition of claim 2, wherein the terminally unsaturated hydrocarbon monomer is a polymer having 12 carbon atoms or more and comprising a plurality of unsaturated groups and the thiol terminated hydrocarbon monomer is a substituted or unsubstituted, linear, branched or cyclic $C_3$ to $C_{36}$ saturated hydrocarbon having two or more terminal thiol groups.

4. The composition of claim 3, wherein the polymer is a compound of formula 6:

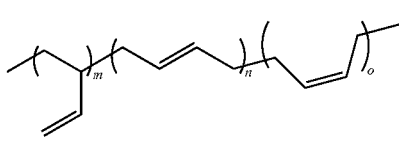

(6)

where:
m ranges from about 70 mol % to about 90 mol %; and
n and o each range from 0 mol % to about 30 mol %, where n+o ranges from about 10 mol % to about 30 mol %.

5. The composition of claim 1, wherein the thiol terminated hydrocarbon monomer is chosen from the compounds of formulae 1 and 2:

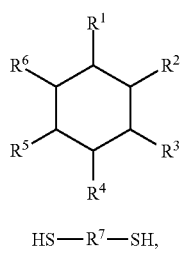

(1)

HS—R$^7$—SH, (2)

where:
$R^1$, $R^2$, $R^3$, $R^4$, $R^5$, and $R^6$ are independently chosen from hydrogen, —SH and —R'SH, where R' is a $C^1$ to $C^{10}$ hydrocarbon bridge and at least two of $R^1$, $R^2$, $R^3$, $R^4$, $R^5$, and $R^6$ are not hydrogen; and
$R^7$ is a $C_2$ to $C_{10}$ hydrocarbon bridge.

6. The composition of claim 1, wherein the thiol terminated hydrocarbon monomer is a compound of formula 1:

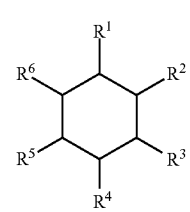

(1)

where:
$R^1$, $R^2$, $R^3$, $R^4$, $R^5$, and $R^6$ are independently chosen from hydrogen, —SH and —R'SH, where R' is a $C_1$ to $C_{10}$ hydrocarbon bridge and at least two of $R^1$, $R^2$, $R^3$, $R^4$, $R^5$, and $R^6$ are not hydrogen.

7. The composition of claim 6, wherein the terminally unsaturated hydrocarbon monomer is a substituted or unsubstituted, linear, branched or cyclic $C_3$ to $C_{36}$ hydrocarbon that is internally saturated and has two or more terminal vinyl or alkynyl groups.

8. The composition of claim 6, wherein the hydrocarbon monomer is a compound of formula of 3, 4, or 5:

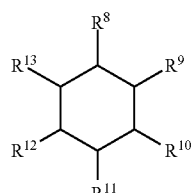

(3)

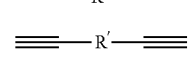

(4)

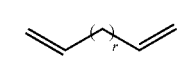

(5)

where:
$R^8$, $R^9$, $R^{10}$, $R^{11}$, $R^{12}$, and $R^{13}$ are independently chosen from hydrogen and alkenyl substituents having a terminal vinyl group, where at least two of $R^8$, $R^9$, $R^{10}$, $R^{11}$, $R^{12}$, and $R^{13}$ are not hydrogen;
R' is a $C_2$ to $C_{10}$ hydrocarbon bridge; and
r is an integer ranging from 1 to 10.

9. The composition of claim 6, wherein the at least one additional monomer is a silane monomer substituted with two or more $C_2$ to $C_8$ terminally unsaturated alkenyl groups or $C_2$ to $C_8$ terminally unsaturated alkynyl groups.

10. The composition of claim 1, wherein the at least one additional monomer is the isocyanate functionalized hydrocarbon monomer.

11. The composition of claim 10, wherein the thiol terminated hydrocarbon monomer is a substituted or unsubstituted, linear, branched or cyclic $C_3$ to $C_{36}$ saturated hydrocarbon monomer having two or more terminal thiol groups.

12. The composition of claim 10, wherein the isocyanate functionalized hydrocarbon monomer is a substituted or unsubstituted, linear, branched or cyclic $C_3$ to $C_{36}$ saturated hydrocarbon monomer having two or more terminal isocyanate groups.

13. The composition of claim 10, wherein the isocyanate functionalized hydrocarbon monomer is a compound of formula 7 or 8:

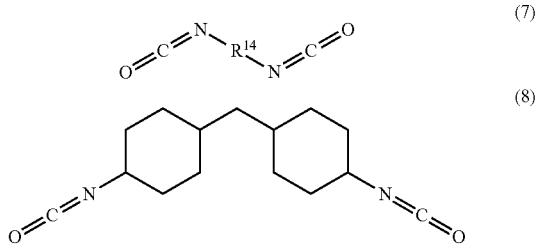

where $R^{14}$ is a $C_3$ to $C_{12}$ n-alkyl bridge.

14. The composition of claim 1, further comprising a plasticizing additive.

15. The composition of claim 1, wherein the particulate filler comprises at least one material chosen from germanium, $CaF_2$, NaCl, KCl, KBr, diamond, Si, CsI, MgO, MgF2, LiF, $BaF_2$, Thallium Bromoiodide (ThBrI), and Thallium Bromochloride (ThBrCl).

16. The composition of claim 1, wherein the particulate filler comprises one or more ligands attached thereto.

17. The composition of claim 16, wherein the ligands are chosen from thiols having a hydrocarbon moiety, saturated or unsaturated alkyl amines and saturated or unsaturated alkyl carboxylic acids.

18. The composition of claim 1, wherein the particulate fillers are in an amount ranging from about 5% by weight to about 95% by weight based on the total dry weight of the composition.

19. A composite, comprising:
a copolymer made from a thiol terminated hydrocarbon monomer and at least one additional monomer chosen from the compounds of i) a terminally unsaturated hydrocarbon monomer, ii) an isocyanate functionalized hydrocarbon monomer and iii) a silane monomer substituted with two or more $C_2$ to $C_8$ terminally unsaturated alkenyl groups or $C_2$ to $C_8$ terminally unsaturated alkynyl groups; and
a particulate filler dispersed in the copolymer, the particulate filler having an average discrete particle size ranging from about 10 nm to about 250 nm as measured by direct imaging with Transmission Electron Microscopy (TEM),
wherein the composite is transmissive to radiation at one or more wavelengths in both the visible and infrared spectrums.

20. The composite of claim 19, wherein the particulate filler comprises at least one material chosen from germanium, $CaF_2$, NaCl, KCl, KBr, diamond, Si, CsI, MgO, $MgF_2$, LiF, $BaF_2$, Thallium Bromoiodide (ThBrI), and Thallium Bromochloride (ThBrCl).

21. The composite of claim 19, wherein the composite is in a form of a panel.

22. The composite of claim 21, wherein the panel has a thickness ranging from about 1 micron to about 1 mm.

23. The composite of claim 21, wherein the panel has greater than a 70% average, regular transmission of radiation at a wavelength of 500 nm and at a panel thickness of 0.001 inch, where transmission is determined as $l(t)/l_0$, where $l_0$ is the incident intensity and $l(t)$ is the intensity as a function of thickness.

24. The composite of claim 21, wherein the panel has an average absorption coefficient of less than 75 $cm^{-1}$ for wavelengths of 8000 nm to 12000 nm, where absorption coefficient ($\alpha$) at a given wavelength is determined using the following relationship:

$$\alpha = \frac{4\pi k}{\lambda} \quad (i)$$

where $\alpha$ is the absorption coefficient, $\lambda$ is the wavelength of radiation, and k is the imaginary portion of the complex index of refraction (n+ik), where specific $\alpha$ values are determined at a wavelength of 8000 nm and at each 1000 nm increment thereafter to 12000 nm using equation (i) and the values averaged to arrive at the average absorption coefficient.

25. The composite of claim 21, wherein the panel is transparent in the visual spectrum and at IR wavelengths ranging from about 4 microns to about 12 microns.

26. The composite of claim 19, wherein the particulate fillers are in an amount ranging from about 5% by weight to about 95% by weight, based on the total dry weight of the composite.

27. The composition of claim 19, wherein the particulate filler comprises one or more ligands attached thereto.

28. The composition of claim 27, wherein the ligands are chosen from thiols having a hydrocarbon moiety, saturated or unsaturated alkyl amines and saturated or unsaturated alkyl carboxylic acids.

29. A method of making a composite panel, the method comprising:
i) depositing a layer of a composite mixture on a substrate, the composite mixture comprising:
a) a copolymer made from a thiol terminated hydrocarbon monomer and at least one additional monomer chosen from the compounds of i) a terminally unsaturated hydrocarbon monomer, ii) an isocyanate functionalized hydrocarbon monomer and iii) a silane monomer substituted with two or more $C_2$ to $C_8$ terminally unsaturated alkenyl groups or $C_2$ to $C_8$ terminally unsaturated alkynyl groups,
b) a particulate filler, and
c) a solvent;
ii) drying the layer;
iii) repeating i) and ii) one or more times to form a thin film stack; and
iv) heating the thin film stack at an annealing temperature and annealing pressure to consolidate the film stack into a single composite layer, wherein the particulate filler having an average discrete particle size ranging from about 10 nm to about 250 nm as measured by direct imaging with Transmission Electron Microscopy (TEM), wherein the composite layer is transmissive to radiation at one or more wavelengths in both the visible and infrared spectrums.

30. The method of claim 29, wherein the annealing temperature ranges from about 80° C. to about 160° C. and the annealing pressure ranges from about 50 psi to 5000 psi.

31. The method of claim 30, further comprising removing the layer from the substrate after each time the drying step is carried out, wherein the removed layers are stacked together and consolidated into a thin film.

32. The method of claim 29, wherein the particulate filler comprises at least one material chosen from germanium, $CaF_2$, NaCl, KCl, KBr, diamond, Si, CsI, MgO, $MgF_2$, LiF, $BaF_2$, Thallium Bromoiodide (ThBrI), and Thallium Bromochloride (ThBrCl).

* * * * *